(12) United States Patent
Rajendran

(10) Patent No.: US 8,456,245 B2
(45) Date of Patent: Jun. 4, 2013

(54) TWO LO AND TWO MIXERS GENERATING HIGH FREQUENCY LO SIGNAL

(75) Inventor: Gireesh Rajendran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/271,912

(22) Filed: Oct. 12, 2011

(65) Prior Publication Data

US 2013/0093477 A1 Apr. 18, 2013

(51) Int. Cl.
*H03L 7/00* (2006.01)

(52) U.S. Cl.
USPC ............ 331/31; 331/2; 331/47; 455/260

(58) Field of Classification Search
USPC ........... 331/2, 47, 50, 52; 455/260; 327/105, 327/156; 332/124, 127
See application file for complete search history.

(56) References Cited

U.S. PATENT DOCUMENTS

| | | | | |
|---|---|---|---|---|
| 6,087,865 A | * | 7/2000 | Bradley | 327/117 |
| 6,519,305 B1 | * | 2/2003 | Roth et al. | 375/376 |
| 2002/0006171 A1 | * | 1/2002 | Nielsen | 375/316 |
| 2002/0030546 A1 | * | 3/2002 | Keating | 331/2 |
| 2006/0105729 A1 | * | 5/2006 | Gris | 455/260 |

\* cited by examiner

*Primary Examiner* — Joseph Chang
*Assistant Examiner* — Jeffrey Shin
(74) *Attorney, Agent, or Firm* — Lawrence J. Bassuk; W. James Brady; Frederick J. Telecky, Jr.

(57) ABSTRACT

One embodiment of the present invention relates to a system that provides a high frequency local oscillator (LO) signal. The system comprises a first LO that generates a first frequency LO signal component, a mixer that generates a difference signal from the first frequency LO signal component and a second frequency LO signal component, and a second LO that generates the second frequency LO signal component that is a harmonic of the difference signal.

17 Claims, 2 Drawing Sheets

TWO LO AND TWO MIXERS GENERATING HIGH FREQUENCY LO SIGNAL

TECHNICAL FIELD

The present invention relates generally to electronic circuits, and specifically to systems and methods for generating a high frequency local oscillator signal.

BACKGROUND

In many applications it is desirable to provide a high frequency (e.g., greater than 40 GHz) local oscillator (LO) signal, for example, as a clock signal. However, when generating a substantially high frequency LO signal, it is impractical to employ a single LO that directly generates the substantially high LO signal. Therefore, multipliers, dividers, mixers and filters are employed to provide such high frequency LO signals. The multipliers, dividers, mixers and filters upconvert LO signals, downconvert LO signals, mix the upconverted and downconverted signals sand filter out the unwanted components that result from the mixing of the LO signals.

FIG. 1 illustrates an example prior art system 10 for providing a substantially high frequency LO signal. In the example prior art system 10, a 63 GHz LO signal is generated employing a LO 12 that generates an 18 GHz signal. The 18 GHz signal is multiplied three times by a 3-times multiplier 14 to generate a 54 GHz signal. The 18 GHz signal is also divided by two by a divide-by-two divider 16 to generate a 9 GHz signal. The 9 GHZ signal is divided by N by a divide-by-N divider 18 to generate a reference signal, where N is an integer that is greater than one. The reference signal is employed by a phase lock loop (PLL) circuit 20 to correct for errors in the generation of the 18 GHz signal. The 54 GHz signal component is mixed with the 9 GHz signal component via a mixer 22 to produce a 63 GHz signal. The mixing of the two signal components also produces a 45 GHz image signal. Due to the fact that the image signal frequency and the signal frequency are relatively close together (i.e., produce a signal to image frequency of about 1.4), a relatively expensive RF filter 24 needs to be employed for image rejection and to produce an accurate 63 GHz signal.

SUMMARY

In an aspect of the present invention, a system provides a high frequency local oscillator (LO) signal. The system comprises a first LO that generates a first frequency LO signal component, a mixer that generates a difference signal from the first frequency LO signal component and a second frequency LO signal component, and a second LO that generates the second frequency LO signal component that is a harmonic of the difference signal.

In another aspect of the present invention, a system provides a high frequency LO signal. The system comprises a first LO that generates a first frequency LO signal component, a second LO that generates a second frequency LO signal component that is a harmonic of another signal wherein the first frequency LO signal component and the second LO signal component are selected to provide a relatively high frequency LO signal to image signal ratio. The system further comprises a mixer that generates the high frequency LO signal from the first frequency LO signal component and the second frequency LO signal component.

In yet another aspect of the invention, a method provides a high frequency LO signal. The method comprises generating a first frequency LO signal component, generating a second frequency LO signal component and generating a difference signal from the first frequency LO signal component and the second frequency LO signal component, wherein the second frequency LO signal component is a harmonic of the difference signal.

DETAILED DESCRIPTION

Figure 1:
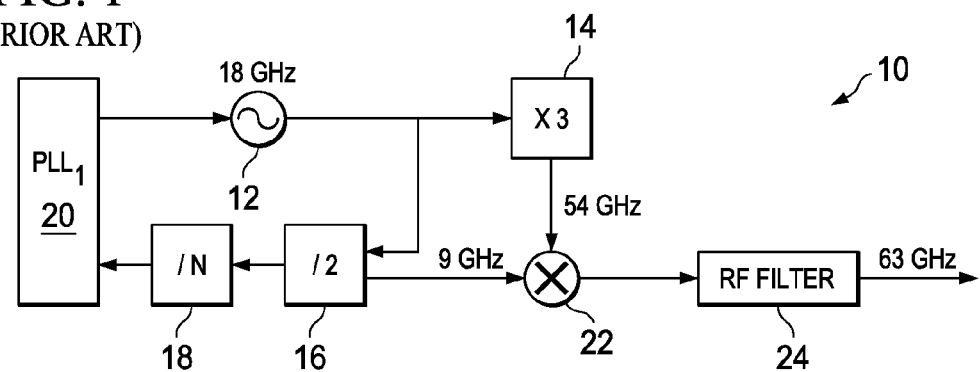
FIG. 1 illustrates a prior art example of a system for providing a high frequency LO signal.
Figure 2:
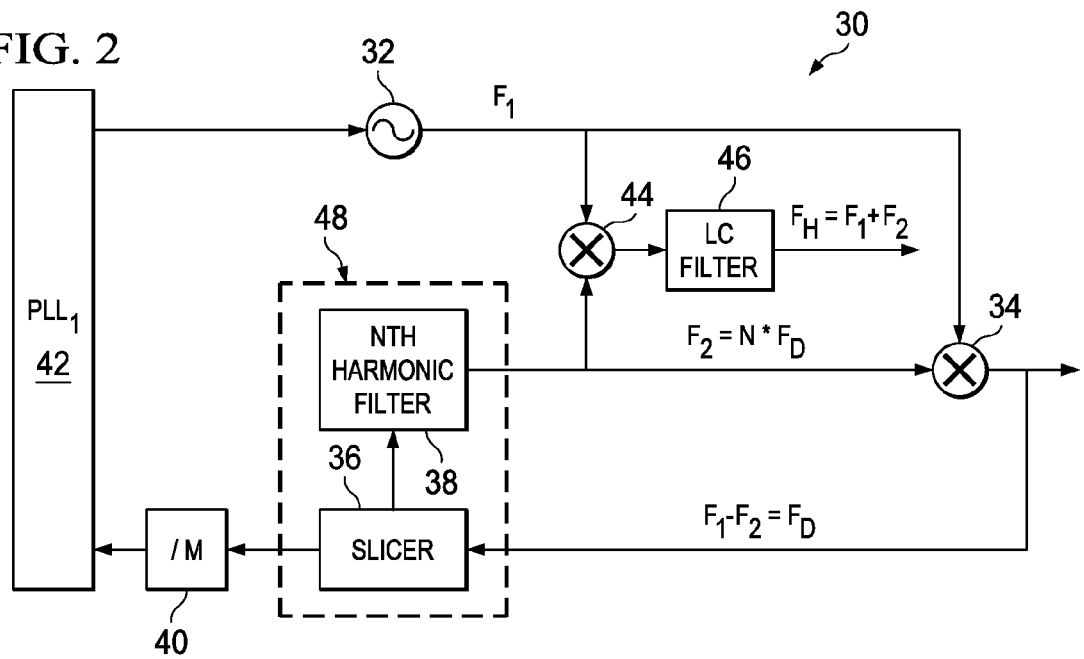
FIG. 2 illustrates an example of a system for providing a high frequency LO signal in accordance with an aspect of the invention.

FIG. 2 illustrates an example of a system 30 for providing a substantially high frequency (e.g., greater than 40 GHz) LO signal in accordance with an aspect of the invention. The system 30 includes a LO 32 that generates a first frequency LO signal component $F_1$. The first frequency LO signal component $F_1$ is mixed with a second frequency LO signal component $F_2$ to generate a substantially high frequency LO signal $F_H = F_1 + F_2$. The first frequency LO signal component $F_1$ is also mixed with the second frequency LO signal component $F_2$ to generate a difference signal $F_D$, such that $F_D = F_1 - F_2$. The difference signal $F_D$ is provided to a slicer 36, which generates a plurality of harmonics of the difference signal $F_D$. The output of the slicer 36 provides the difference signal $F_D$ to a divide-by-M divider 40 to divide the difference signal and to generate a reference signal, where M is an integer that is greater than one. The reference signal is employed by a phase lock loop (PLL) circuit 42 to ensure the difference $F_D$ between the first and second frequency LO signal components $F_1$ and $F_2$ is locked and to correct for errors in the generation of the first frequency LO signal component $F_1$.

An Nth harmonic filter 38 filters out all but one of the harmonics N and injection locks the second frequency LO signal component $F_2$, such that $F_2 = N*F_D$, where N is an integer greater than or equal to one. The slicer 36 and the Nth harmonic filter 38 form a second LO 48. The first and second frequency LO signal components F1 and F2 are selected close together to provide a relatively small difference signal FD, such that the ratio of the substantially high frequency LO signal to image signal is relatively high (e.g., greater than 5). Therefore, an ordinary inexpensive LC tank filter 46 coupled to the output of the first mixer 44 is sufficient to reject the image frequency generated by the mixing of the first and second frequency LO signal components $F_1$ and $F_2$. Furthermore, based on the above equations and simple substitution and a known desired $F_H$ and $F_D$, one can solve for N to determine a desired harmonic of $F_D$ to generate $F_2$ based on the following equations:

$$F_2 = N*F_D \qquad \text{EQ. 1}$$

$$F_1 - F_2 = F_D \qquad \text{EQ. 2}$$

so that $$F_1 = F_D + F_2 \qquad \text{EQ. 3}$$

and substituting for $F_2$:

$$F_1=(N+1)*F_D \qquad \text{EQ. 4}$$

and $$F_H=F_1+F_2 \qquad \text{EQ. 5}$$

and substituting for $F_1$ and $F_2$:

$$F_H=(N+1)*F_D+N*F_D \qquad \text{EQ. 6,}$$

which can be written as:

$$F_H=F_D*(2N+1) \qquad \text{EQ. 7}$$

For example, if one desires to obtain a frequency of 63 GHz for $F_H$ employing a difference frequency $F_D$ of 9 GHz, then N would be equal to three such that the 3rd Harmonic of the difference frequency $F_D$ of 27 GHz would be employed to generate second frequency LO signal component $F_2$.

Figure 3:
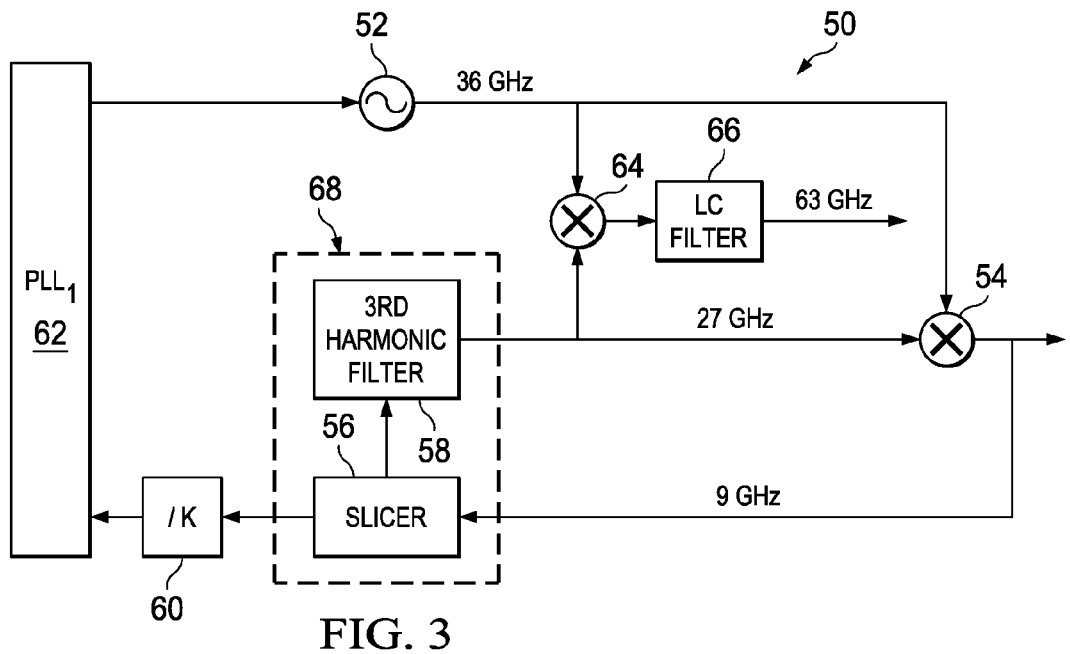
FIG. 3 illustrates another example of a system for providing a high frequency LO signal in accordance with an aspect of the invention.

FIG. 3 illustrates an example of a system 50 for providing a 63 GHz frequency LO signal in accordance with an aspect of the invention. The system 50 includes a LO 52 that generates a first frequency LO signal component of 36 GHz. The first frequency LO signal component of 36 GHz is mixed via a mixer 64 with a second frequency LO signal component of 27 GHz to generate the 63 GHz frequency LO signal. The first frequency LO signal component of 36 GHz is also mixed via a mixer 54 with the second frequency LO signal component of 27 GHz to generate a difference signal of 9 GHz. The difference signal of 9 GHz is provided to a slicer 56, which generates a plurality of harmonics of the 9 GHz difference signal. The output of the slicer 56 provides the 9 GHz difference signal to a divide-by-K divider 60 to divide the difference signal and to generate a reference signal, where K is an integer that is greater than one. The reference signal is employed by a phase lock loop (PLL) circuit 62 to ensure the difference between the first and second frequency LO signal components of 36 GHz and 27 GHz is locked and/or to correct for errors in the generation of the first frequency LO signal component of 36 GHz. A 3rd harmonic filter 58 filters out all but one of the harmonics and injection locks the second frequency LO signal component to 27 GHz. The slicer 56 and the Nth harmonic filter 58 form a second LO 68. The first and second frequency LO signal components are close together to provide a relatively small difference signal of 9 GHz such that the ratio of the substantially high frequency LO signal to image signal is 7. Therefore, an ordinary inexpensive LC tank filter 66 coupled to the output of the mixer 66 is sufficient to reject the image frequency generated by the mixing of the first and second frequency LO signal components of 36 GHz and 27 GHz.

Figure 4:
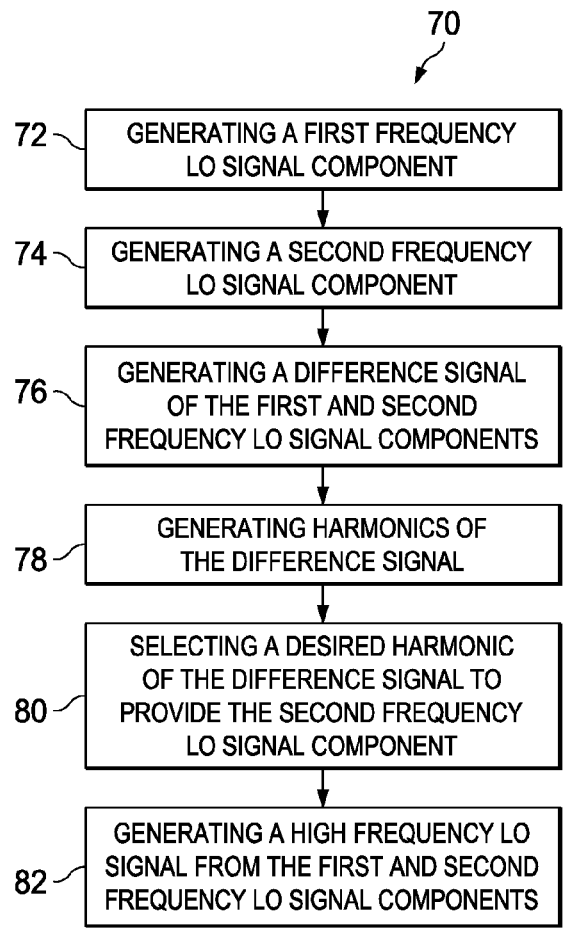
FIG. 4 illustrates an example of a method for providing a high frequency LO signal in accordance with an aspect of the invention.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method.

FIG. 4 illustrates an example of a method 70 for providing a high frequency LO signal in accordance with an aspect of the present invention. The method 70 begins at 72 where a first frequency LO signal component is generated, for example, via a LO. At 74, a second frequency LO signal component is generated, for example, as a harmonic of a difference signal. At 76, the difference signal of the first and second frequency LO signal components is generated, for example, via a mixer. At 78, harmonics of the difference signal is generated, for example, via a slicer. At 80, a desired harmonic of the difference signal is selected to provide the second frequency LO signal, for example, via a harmonic filter. At 82, the high frequency LO signal is generated from the first and second frequency LO signal components, for example, via a mixer.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system for proving a high frequency local oscillator output signal, the system comprising:
    a first local oscillator that generates a first frequency signal component;
    a first mixer that generates a difference signal from the first frequency signal component and a second frequency signal component;
    a second local oscillator that generates the second frequency signal component that is a harmonic of the difference signal; and
    a second mixer that generates the high frequency local oscillator output signal from the first frequency signal component and the second frequency signal component.

2. The system of claim 1, wherein the second local oscillator is formed of a slicer that receives the difference signal and generates a plurality of harmonics and a harmonic filter that filters out each of the plurality of harmonics but a desired harmonic that provides the second frequency signal component.

3. The system of claim 1, including a filter coupled to an output of the second mixer to filter out image signals of the high frequency local oscillator output signal.

4. The system of claim 3, wherein the filter is an inductor (L)-capacitor (C) filter.

5. The system of claim 1, including a divider that divides the difference signal to provide a reference signal and a phase locked loop (PLL) circuit that employs the reference signal to correct errors associated with the first frequency signal component and/or the difference signal.

6. The system of claim 1, wherein the first frequency signal component and the second frequency signal component are selected to provide a relatively high high frequency local oscillator output signal to image signal ratio.

7. The system of claim 6, wherein the first frequency signal component is 36 GHz and the second frequency signal component is 27 GHz and the difference signal is 9 GHz such that the high frequency local oscillator output signal is 63 GHz.

8. A system for proving a high frequency local oscillator output signal, the system comprising:
    a first local oscillator that generates a first frequency signal component;
    a second local oscillator that generates a second frequency signal component that is a harmonic of another signal, wherein the first frequency signal component and the second frequency signal component are selected to provide a relatively high high frequency local oscillator output signal to image signal ratio; and
    a first mixer that generates the high frequency local oscillator output signal from the first frequency signal component and the second frequency signal component; and a second mixer that generates the another signal, which is a difference signal of the first frequency signal component and the second frequency signal component.

9. The system of claim 8, wherein the first frequency signal component is 36 GHz and the second frequency signal component is 27 GHz and the difference signal is 9 GHz such that the high frequency local oscillator output signal is 63 GHz.

10. The system of claim 8, wherein the second mixer is formed of a slicer that receives the difference signal and generates a plurality of harmonics and a harmonic filer that filters out each of the plurality of harmonics but a desired harmonic that provides the second frequency signal component.

11. The system of claim 8, including a filter coupled to an output of the first mixer to filter out image signals of the high frequency local oscillator output signal.

12. The system of claim 11, wherein the filter is an inductor (L)-capacitor (C) filter.

13. A method for proving a high frequency local oscillator output signal, the method comprising:
generating a first frequency signal component;
generating a second frequency signal component;
generating a difference signal from the first frequency signal component and the second frequency signal component, wherein the second frequency signal component is a harmonic of the difference signal; and
mixing the first frequency signal component and the second frequency signal component to form the high frequency local oscillator output signal.

14. The method of claim 13, including generating a plurality of harmonics of the difference signal and filtering out each of the plurality of harmonics but a desired harmonic that provides the second frequency signal component.

15. The method of claim 13, including filtering the high frequency local oscillator output signal to filter out image signals of the high frequency local oscillator output signal.

16. The method of claim 13, including dividing the difference signal to provide a reference signal and employing the reference signal to correct errors associated with the first frequency signal and/or the difference signal.

17. The method of claim 13, including selecting the first frequency signal component and the second frequency signal component to provide a relatively high high frequency local oscillator output signal to image signal ratio.

* * * * *